(12) United States Patent
Xu et al.

(10) Patent No.: US 11,160,166 B2
(45) Date of Patent: Oct. 26, 2021

(54) PRINTED CIRCUIT BOARD WITH HIGH-CAPACITY COPPER CIRCUIT

(71) Applicants: Avary Holding (Shenzhen) Co., Limited., Shenzhen (CN); HongQiSheng Precision Electronics (QinHuangDao) Co.,Ltd., Qinhuangdao (CN)

(72) Inventors: Fang-Bo Xu, Shenzhen (CN); Peng Wu, Shenzhen (CN); Jian-Quan Shen, Shenzhen (CN); Ke-Jian Wu, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 382 days.

(21) Appl. No.: 15/870,865

(22) Filed: Jan. 13, 2018

(65) Prior Publication Data
US 2018/0139842 A1    May 17, 2018

Related U.S. Application Data

(62) Division of application No. 15/394,735, filed on Dec. 29, 2016, now Pat. No. 9,907,167.

(30) Foreign Application Priority Data

Oct. 6, 2016 (CN) .......................... 201610880403.9

(51) Int. Cl.
| H05K 1/09 | (2006.01) |
| H05K 1/11 | (2006.01) |
| H05K 3/46 | (2006.01) |
| H05K 1/02 | (2006.01) |
| H05K 3/28 | (2006.01) |

(Continued)

(52) U.S. Cl.
CPC ............. *H05K 1/09* (2013.01); *H05K 1/0225* (2013.01); *H05K 1/111* (2013.01); *H05K 3/0026* (2013.01);
(Continued)

(58) Field of Classification Search
CPC ........ H05K 1/09; H05K 1/111; H05K 3/0026; H05K 3/188; H05K 3/282; H05K 1/0225;
(Continued)

(56) References Cited

U.S. PATENT DOCUMENTS 3,791,858 A * 2/1974 McPherson .......... H05K 3/4647
430/314
5,338,900 A * 8/1994 Schneider ........... H01L 21/6835
174/250

(Continued)

FOREIGN PATENT DOCUMENTS

| CN | 102196668 | 9/2011 |
| TW | M299436 | 10/2006 |
| TW | 201134322 | 10/2011 |

*Primary Examiner* — Ishwarbhai B Patel
(74) *Attorney, Agent, or Firm* — ScienBiziP, P.C.

(57) ABSTRACT

A printed circuit board with high-capacity and high-current copper circuit includes a conductive trace, a first protecting layer, and a second protecting layer on opposite sides of the conductive trace. The conductive trace includes a basic conductive trace pattern, a first conductive trace pattern, and a second conductive trace pattern. The first and second conductive trace patterns are directly formed on opposite surfaces of the basic copper conductive trace pattern. A width of trace of the first conductive trace pattern is the same as a line width of the second conductive trace pattern.

11 Claims, 7 Drawing Sheets

(51) Int. Cl.
*H05K 3/18* (2006.01)
*H05K 3/00* (2006.01)

(52) U.S. Cl.
CPC ............ *H05K 3/188* (2013.01); *H05K 3/282* (2013.01); *H05K 3/4682* (2013.01); *H05K 2201/0137* (2013.01); *H05K 2201/0154* (2013.01); *H05K 2203/0228* (2013.01); *H05K 2203/107* (2013.01); *Y10T 29/49155* (2015.01)

(58) Field of Classification Search
CPC ......... H05K 3/4682; H05K 2203/0228; H05K 2203/107; H05K 2201/0154; H05K 2201/0137; H05K 2203/054; H05K 3/243; H05K 3/06; H05K 1/11; Y10T 29/49155
See application file for complete search history.

(56) References Cited

U.S. PATENT DOCUMENTS

| | | | |
|---|---|---|---|
| 8,377,317 B2 | 2/2013 | Bai et al. | |
| 9,832,866 B2 * | 11/2017 | Ahn | H05K 1/165 |
| 2007/0268675 A1 * | 11/2007 | Chinda | H01L 21/4853 |
| | | | 361/748 |
| 2011/0154657 A1 * | 6/2011 | Chuang | H05K 3/0097 |
| | | | 29/829 |
| 2011/0155439 A1 * | 6/2011 | Yamada | H05K 3/4652 |
| | | | 174/264 |
| 2015/0245484 A1 * | 8/2015 | Ryu | H05K 1/0271 |
| | | | 174/262 |
| 2015/0351219 A1 * | 12/2015 | Oh | H05K 1/0206 |
| | | | 174/252 |

* cited by examiner

PRINTED CIRCUIT BOARD WITH HIGH-CAPACITY COPPER CIRCUIT

This application is a divisional application of a commonly-assigned application entitled "PRINTED CIRCUIT BOARD WITH HIGH-CAPACITY COPPER CIRCUIT AND METHOD FOR MANUFACTURING SAME" filed on 2016 Dec. 29 with application Ser. No. 15/394,735 and issued on 2018 Feb. 27 with U.S. Pat. No. 9,907,167. The above-identified application is incorporated herein by reference.

TECHNICAL FIELD

The subject matter herein generally relates to printed circuit boards.

BACKGROUND

A printed circuit board (PCB) generally includes a circuit layer for transmitting electric signals and connecting electronic components. A circuit line width of a PCB production process is limited to a thickness of copper traces. Only thin copper is used to form fine conductive traces.

BRIEF DESCRIPTION OF THE DRAWINGS

Implementations of the present technology will now be described, by way of example only, with reference to the attached figures.

DETAILED DESCRIPTION

Figure 1:
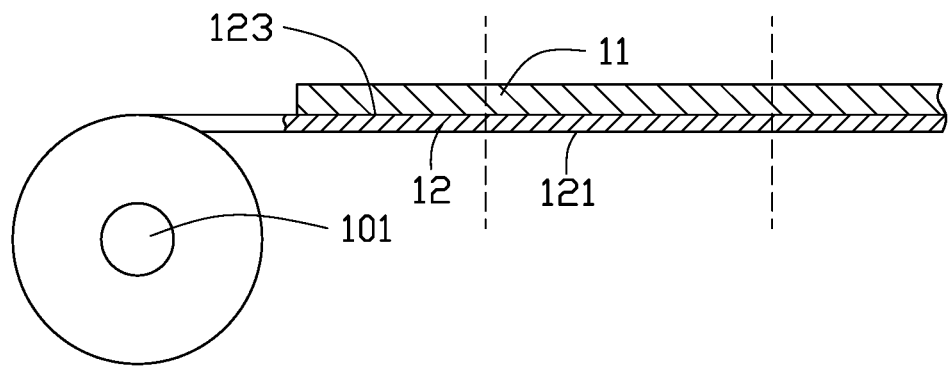
FIG. 1 illustrates a flexible base copper provided as a foil on a roll.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined as essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 15:
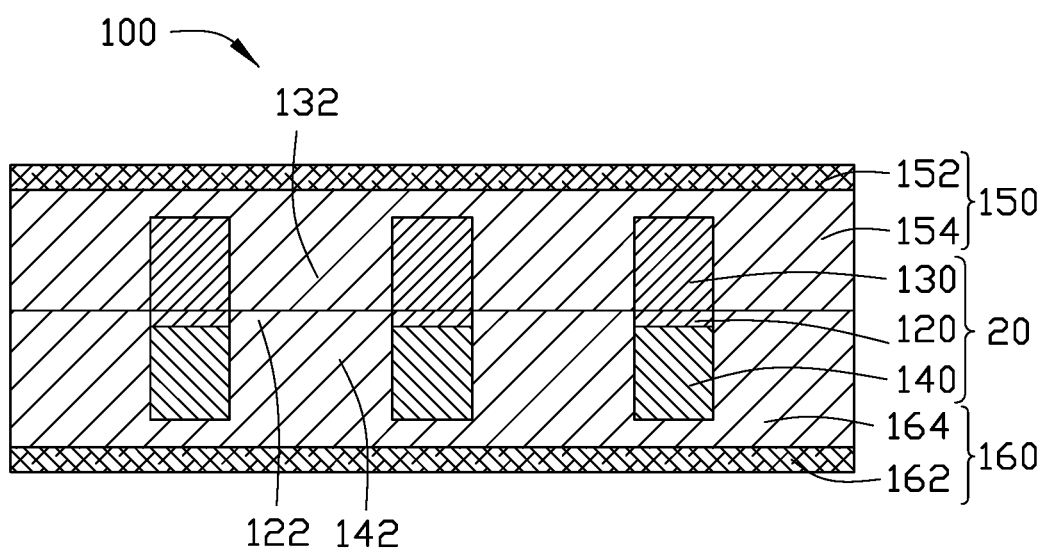
FIG. 15 is a cross-sectional view of a second protecting layer laminated on the second conductive trace pattern, a printed circuit board with high-capacity copper circuit being thereby obtained.

FIG. 15 illustrates a printed circuit board with high-capacity copper circuit 100 according to a first exemplary embodiment. The printed circuit board with high-capacity copper circuit 100 includes a conductive trace 20, a first protecting layer 150, and a second protecting layer 160. The first protecting layer 150 and the second protecting layer 160 are formed on opposite sides of the conductive trace 20. The conductive trace 20 includes a base conductive trace pattern 120, a first conductive trace pattern 130, and a second conductive trace pattern 140. The base conductive trace pattern 120 is sandwiched between the first conductive trace pattern 130 and the second conductive trace pattern 140.

In this exemplary embodiment, the first conductive trace pattern 130 and the second conductive trace pattern 140 are directly formed on opposite surfaces of the base copper conductive trace pattern 120 by using a copper plating method, for example. The first conductive trace pattern 130 and the second conductive trace pattern 140 are in electrically contact with the base conductive trace pattern 120. A line width of the base conductive trace pattern 120, a line width of the first conductive trace pattern 130, and a line width of the second conductive trace pattern 140 are substantially the same. A thickness of the first conductive trace pattern 130 is equal to a thickness of the second conductive trace pattern 140. In the illustrated embodiment, a thickness of the first conductive trace pattern 130 and a thickness of the second conductive trace pattern 140 are in a range from about 60 to 70 microns (i.e., 60 to $70*10^{-6}$ meters).

The first protecting layer 150 covers the first conductive trace pattern 130, and fills in the first gaps 132 between the first conductive trace pattern 130. The second protecting layer 160 covers the second conductive trace pattern 140, and fills in the second gaps 142 between the second conductive trace pattern 140 and the third gaps 122 between the base conductive trace pattern 120. In the illustrated embodiment, the first protecting layer 150 is a Cover Layer (CVL), and includes a base layer 152 and an adhering layer 154 formed on the base layer 152.

Figure 16:
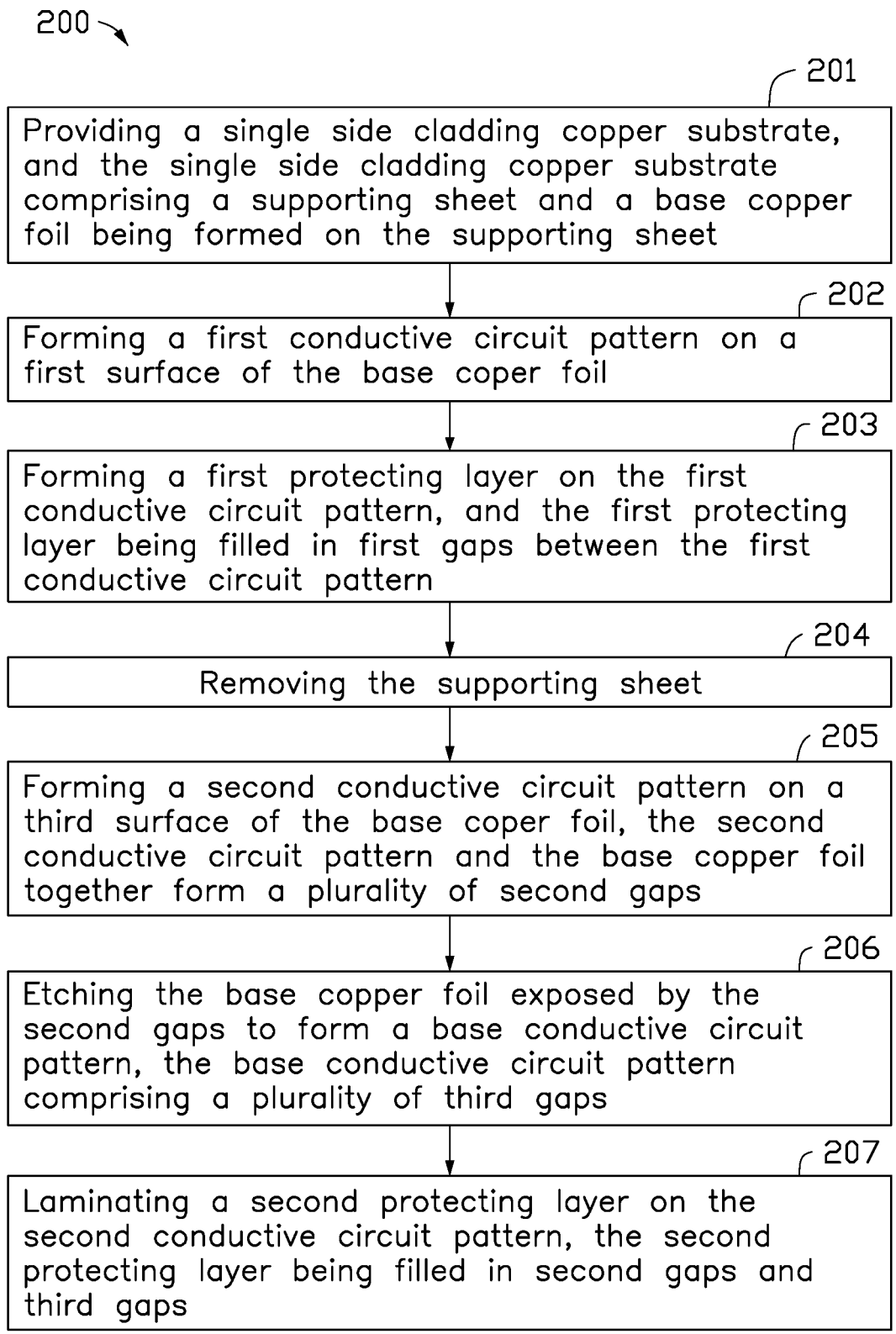
FIG. 16 illustrates a flowchart of a manufacturing method for a printed circuit board with high-capacity copper circuit.

FIG. 16 illustrates a flowchart of a manufacturing method in accordance with a second exemplary embodiment. An exemplary method 200 for manufacturing the thick copper circuit 100 (shown in FIG. 15) is provided by way of an example, as there are a variety of ways to carry out the method. Additionally, the illustrated order of blocks is by way of example only. The order of the blocks may change. The method 200 can begin at block 201, as shown in FIG. 16.

Figure 2:
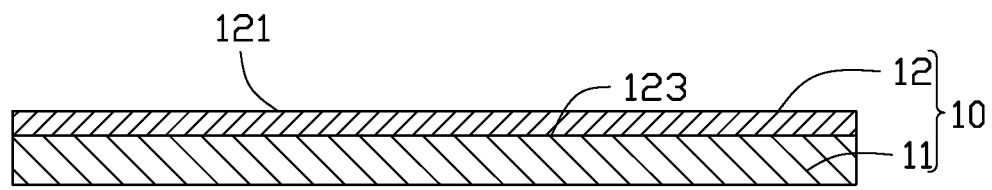
FIG. 2 is a cross-sectional view of a single side copper cladding substrate.

At block 201, with reference to FIG. 1 and FIG. 2, a copper cladding substrate 10 is provided. The single side copper cladding substrate 10 includes a supporting sheet 11 and a base copper foil 12. The base copper foil 12 includes a first surface 121 and a second surface 123 opposite to the first surface 121. The supporting sheet 11 is located on the second surface 123. The supporting sheet 11 is selected from a group consisting of polyethylene glycol terephthalate (PET), poly naphthalene dicarboxylic acid glycol ester (PEN), and polyimide (PI).

In the illustrated embodiment, a method of providing the single side copper cladding substrate 10 includes the following steps. First, as shown in FIG. 1, a roll (roll 101) of flexible base copper foil 12 is provided and the base copper foil 12 is unrolled. The thickness of the base copper foil 12 is about 18 micrometers. The base copper foil 12 includes the first surface 121 and the second surface 123 opposite to the first surface 121. Second, the supporting sheet 11 is laminated to the second surface 123, and the base copper foil 12 adhering to the supporting sheet 11 is cut to a required size, thereby forming a plurality of pieces of the single side copper cladding substrate 10. In other embodiments, the supporting sheet 11 is provided from a wrapped roll and the supporting sheet 11 is unrolled. A copper plating method, or a copper deposition method or a sputtering process can then be used to form the base copper foil 12 on the supporting sheet 11, creating a single side copper cladding substrate 10.

Figure 3:
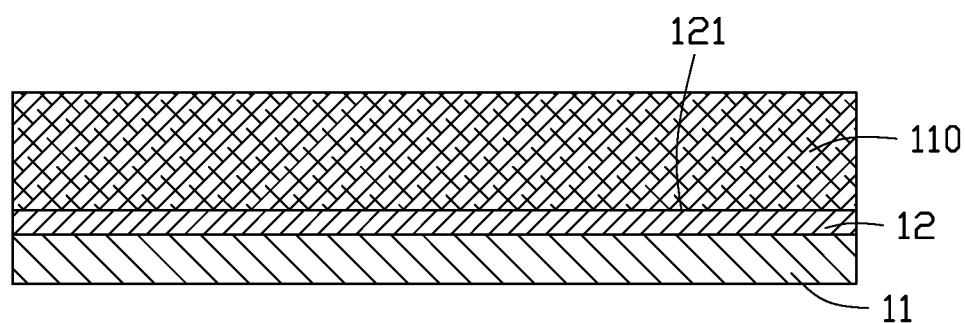
FIG. 3 is a cross-sectional view of a photosensitive film laminated to a first surface of the base copper foil.

At block 202, with reference to FIG. 3 to FIG. 6, a first conductive trace pattern 130 is formed on the first surface 121 by using a copper electroplating method, for example. A first conductive circuit pattern is formed on a first surface of the base copper foil 12. In the illustrated embodiment, a method for forming the first conductive trace pattern 130 is as follows:

As shown in FIG. 3, a photosensitive film 110 is adhered to the first surface 121, a thickness of the photosensitive film 110 is about 75 microns.

Figure 4:
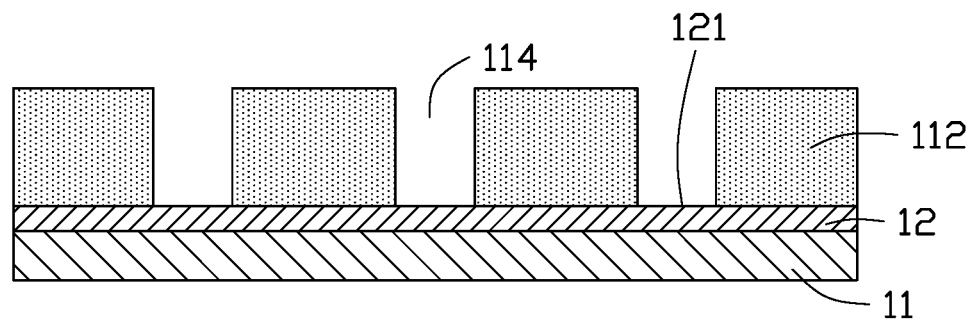
FIG. 4 is a cross-sectional view of the photosensitive film exposed, developed, and etched as a shielding layer on the first surface.

As shown in FIG. 4, the photosensitive film 110 is exposed, developed, and etched. As a result, a first shielding layer 112 is formed on the first surface 121. The first shielding layer 112 includes a plurality of openings 114. The openings 114 expose portions of the base copper foil 12.

Figure 5:
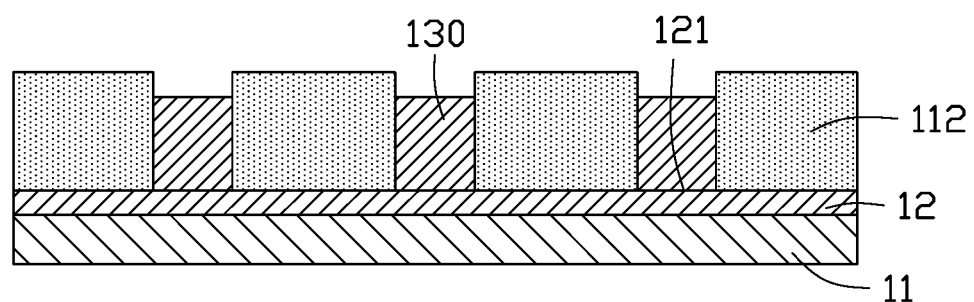
FIG. 5 is a cross-sectional view of a plating copper layer formed on openings of the shielding layer, using a copper plating method.

With reference to FIG. 5, a copper layer is formed in the openings 114 by using a electroplating method, for example. The plated copper layer forms the first conductive trace pattern 130.

Figure 6:
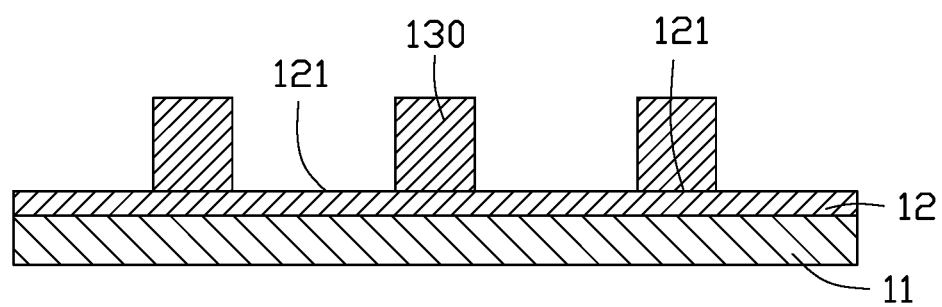
FIG. 6 is a cross-sectional view of the shielding layer removed from the first surface.

With reference to FIG. 6, the first shielding layer 112 is removed from the first surface 121. The first conductive trace pattern 130 is situated on the surface 121 of the base copper foil 12.

Figure 7:
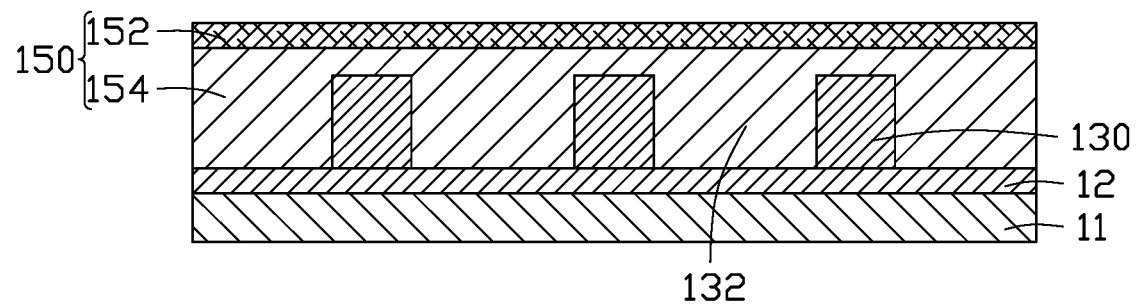
FIG. 7 is a cross-sectional view of a first protecting layer laminated on the first conductive trace pattern.

At block 203, with reference to FIG. 7, a first protecting layer 150 is applied on the first conductive trace pattern 130. The first protecting layer 150 protects the first conductive trace pattern 130 from oxidation, scratches, and so on. In the illustrated embodiment, the first protecting layer 150 is CoverLay (CVL), and includes a base layer 152 and an adhering layer 154 formed on the base layer 152. The adhering layer 154 fills in the first gaps 132 formed by the base copper foil 12 and the first conductive trace pattern 130, and covers the first conductive trace pattern 130. In another exemplary embodiment, the first protecting layer 150 is a solder mask.

Figure 8:
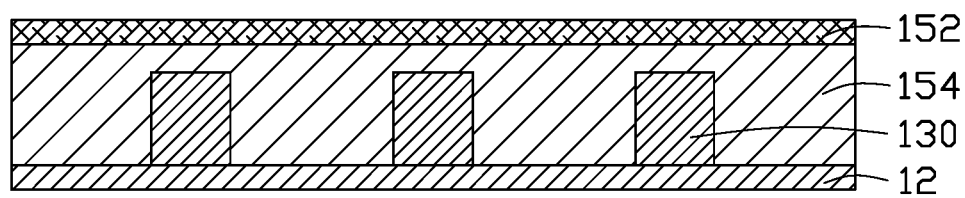
FIG. 8 is a cross-sectional view of a supporting sheet removed from the base copper foil.
Figure 9:
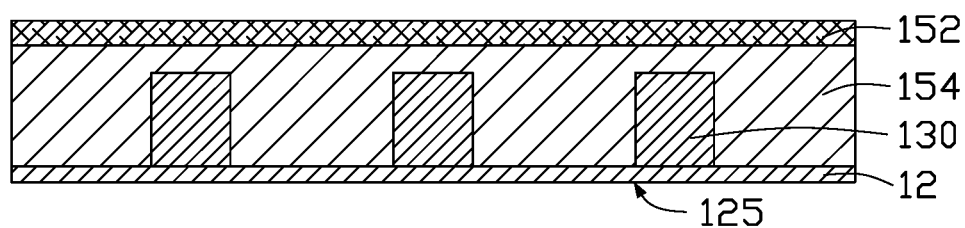
FIG. 9 is a cross-sectional view of the base copper foil reduced using a gridding method.

At block 204, with reference to FIG. 8 and FIG. 9, the supporting sheet 11 (as shown in FIG. 7) is removed from the base copper foil 12, and thickness of the base copper foil 12 is reduced by using a gridding method, for example. A thickness of the base copper foil 12 is reduced. The second surface 123 is removed by grinding, resulting in a third surface 125. In this way, a thickness of the base copper foil 12 is retained to be about 2 to 6 microns.

At block 205, with reference to FIG. 10 to FIG. 13, a second conductive trace pattern 140 is formed on the third surface 125. The shape of the second conductive trace pattern 140 is the same as the shape of the first conductive trace pattern 130, and a thickness of the second conductive trace pattern 140 is substantially equal to a thickness of the first conductive trace pattern 130.

In the illustrated embodiment, the second conductive trace pattern 140 is formed using the same method as that used for the first conductive trace pattern 130. That is to say, the second conductive trace pattern 140 is formed in the following way.

Figure 10:
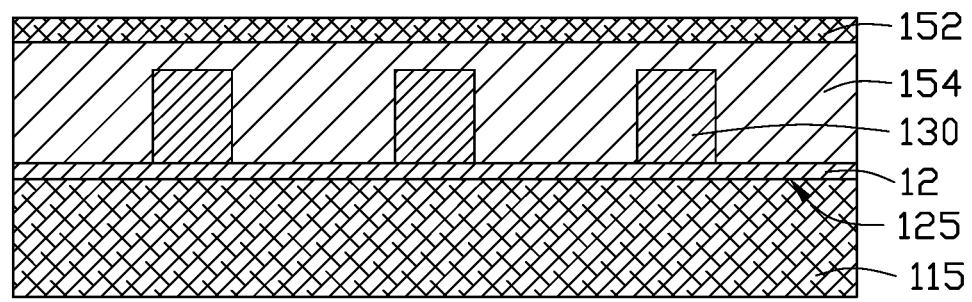
FIG. 10 is a cross-sectional view of a photosensitive film laminated to a third surface of the copper sheet.

Firstly, as shown in FIG. 10, a photosensitive film 115 is laminated to the third surface 125.

Figure 11:
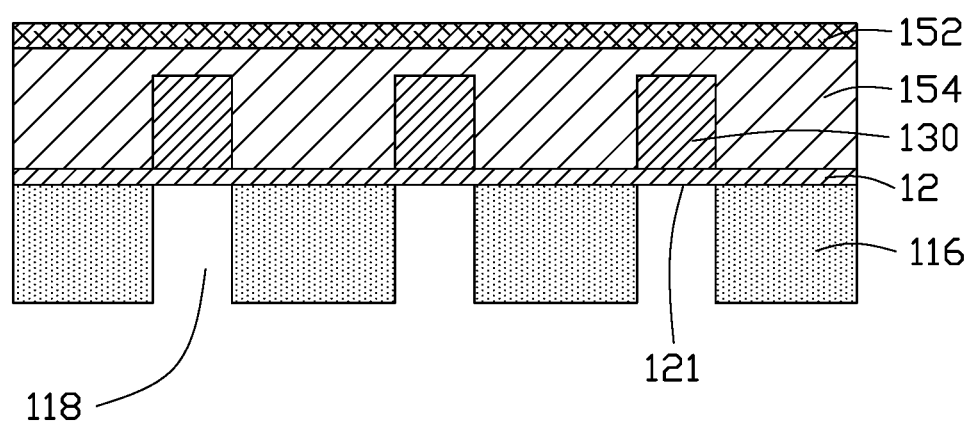
FIG. 11 is a cross-sectional view of a second shielding layer formed on the third surface.

Secondly, the photosensitive film 115 is exposed, developed, and etched to form a second shielding layer 116 on the third surface 125, as shown in FIG. 11. The second shielding layer 116 includes a plurality of openings 118, the openings 118 are configured to expose portions of the base copper foil 12.

Figure 12:
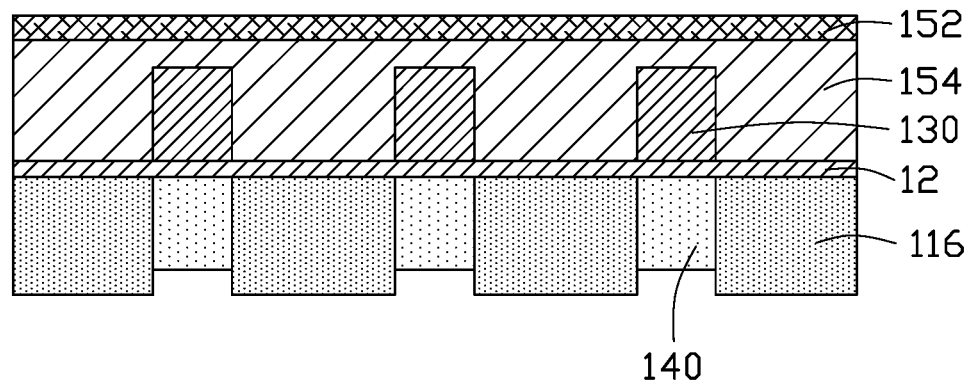
FIG. 12 is a cross-sectional view of a copper plating layer formed on the openings using an electroplating method.

As shown in FIG. 12, a copper layer is formed in the openings 118 by using an electroplating method, for example. The plating copper layer is configured to form the second conductive trace pattern 140.

Figure 13:
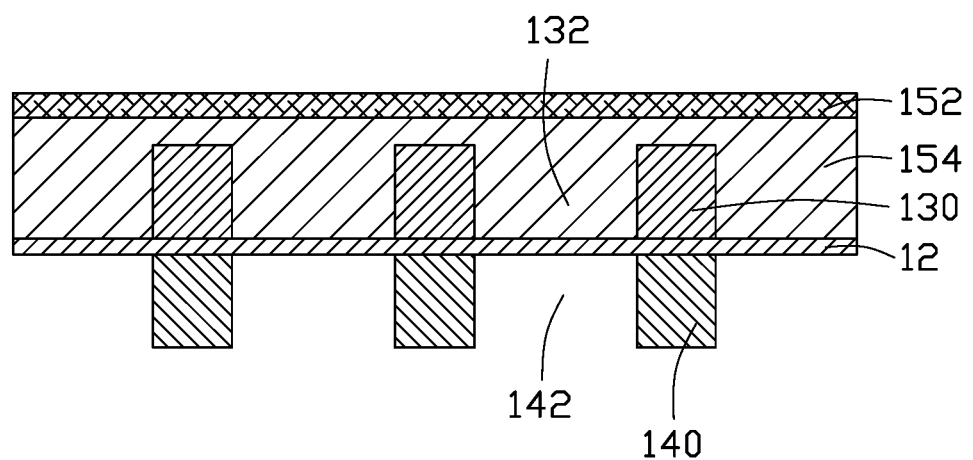
FIG. 13 is a cross-sectional view of the second shielding layer removed to form the second conductive trace pattern on the third surface.

As shown in FIG. 13, the second shielding layer 116 is removed from the base copper foil 12, the second conductive trace pattern 140 being on the third surface 125. The respective thicknesses of the first conductive trace pattern 130 and of the second conductive trace pattern 140 are in a range from about 60 to 70 microns.

Figure 14:
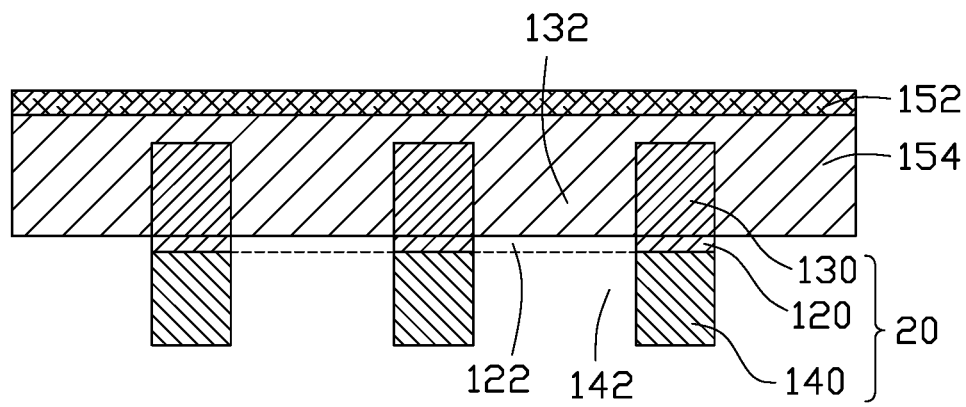
FIG. 14 is a cross-sectional view of the base copper foil etched to form a base conductive trace pattern.

At block 206, with reference to FIG. 14, the base copper foil 12 exposed in parts by the third gaps 122, is removed by etching The remaining portions of the base copper foil 12 form a base conductive trace pattern 120, a thickness of the base conductive trace pattern is about 2-6 microns, in a preferred embodiment, a thickness of the base conductive trace pattern is about 2 microns. The third gaps 122 between the base conductive trace pattern 120, the first gaps 132 between the first conductive trace pattern 130, and the second gaps 142 between the second conductive trace pattern 140 are aligned with each other. That is, the widths of the traces of the base conductive trace pattern 120, of the first conductive trace pattern 130, and of the second conductive trace pattern 140 are substantially the same. The base conductive trace pattern 120, the first conductive trace pattern 130, and the second conductive trace pattern 140 together form the conductive trace 20. A thickness of the conductive trace 20 is about 122 microns to 146 microns. In a preferred embodiment, a thickness of the conductive trace 20 is about 125 microns. A width of each of the first gaps 132 of the first conductive trace pattern 130 is about 100 um or 130 um.

At block 207, with reference to FIG. 15, a second protecting layer 160 is applied on the second conductive trace pattern 140. The second protecting layer 160 also fills in the second gaps 142 between the second conductive trace pattern 140, and the third gaps 122 between the base conductive trace pattern 120. The circuit conductive 20 is formed by using an etching method and an electroplating method, for example. A thickness of the conductive trace 20 is about 125 microns. Thereby, the printed circuit board with thick copper circuit 100 is obtained.

When the printed circuit board with thick copper circuit 100 is in use, openings are formed in the first protective layer 150 and second protection layer 160 by a laser cutting method, and parts of the conductive trace 20 are exposed. The exposed portions can be used as electrical pads, and electronic components can be arranged on such pads.

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A printed circuit board with high-capacity copper circuit comprising:
    a conductive trace;
    a first protecting layer and a second protecting layer respectively formed on two opposite sides of the conductive trace, wherein the conductive trace comprising:
    a base conductive trace pattern, a first conductive trace pattern and a second conductive trace pattern, wherein the first conductive trace pattern and the second conductive trace pattern are directly formed on two opposite sides of the base conductive trace pattern, and wherein a trace width of the first conductive trace pattern is the same as a trace width of the second conductive trace pattern, and is the same as a trace width of the base conductive trace pattern;
    wherein the first conductive trace pattern is embedded in the first protecting layer, and a surface of the first conductive trace pattern away from the base conductive trace pattern is covered by the first protecting layer; the base conductive trace pattern and the second conductive trace pattern are embedded in the second protecting layer, and a surface of the second conductive trace pattern away from the basic conductive trace pattern is covered by the second protecting layer.

2. The printed circuit board of claim 1, wherein the first conductive trace pattern is in electrically contacted with the base conductive trace pattern.

3. The printed circuit board of claim 2, wherein a thickness of the base conductive trace pattern is in a range from about 2 to 6 microns.

4. The printed circuit board of claim 2, wherein the first conductive trace pattern and the second conductive trace pattern are formed on the base conductive trace pattern using copper electroplating method or a chemical vapor deposition method.

5. The printed circuit board of claim 2, wherein a shape of the first conductive trace is the same as a shape of the second conductive trace pattern.

6. The printed circuit board of claim 1, wherein the second conductive trace pattern is in electrically contacted with the base conductive trace pattern.

7. The printed circuit board of claim 1, wherein a thickness of the first conductive trace pattern is the same as a thickness of the second conductive trace pattern.

8. The printed circuit board of claim 7, wherein a thickness of the first conductive trace pattern is in a range from about 60 to 70 microns.

9. The printed circuit board of claim 1, wherein the first protecting layer and the second protecting layer are prepregnant or solder mask.

10. The printed circuit board of claim 1, wherein the first protecting layer is filled in first gaps between the first conductive trace pattern, the second protecting layer is filled in second gaps between the second conductive trace pattern and third gaps between the base conductive trace pattern; and
    wherein the first gaps are formed by a base copper foil and the first conductive trace pattern, the second gaps are formed by the base copper foil and the second conductive trace pattern, and the base copper foil is exposed in parts by the third gaps to form the base conductive trace pattern.

11. The printed circuit board of claim 10, wherein a width of the first gaps is about 100 um or 130 um.

* * * * *